(12) United States Patent
Huang

(10) Patent No.: US 11,935,608 B2
(45) Date of Patent: *Mar. 19, 2024

(54) SIGNAL GENERATION CIRCUIT AND METHOD, AND SEMICONDUCTOR MEMORY

(71) Applicant: CHANGXIN MEMORY TECHNOLOGIES, INC., Hefei (CN)

(72) Inventor: Zequn Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 337 days.

This patent is subject to a terminal disclaimer.

(21) Appl. No.: 17/449,603

(22) Filed: Sep. 30, 2021

(65) Prior Publication Data

US 2023/0005559 A1 Jan. 5, 2023

Related U.S. Application Data

(63) Continuation of application No. PCT/CN2021/106524, filed on Jul. 15, 2021.

(30) Foreign Application Priority Data

Jul. 2, 2021 (CN) .......................... 202110750378.3

(51) Int. Cl.
*H03L 7/099* (2006.01)
*G11C 7/22* (2006.01)
(Continued)

(52) U.S. Cl.
CPC ........ *G11C 29/12015* (2013.01); *G11C 7/222* (2013.01); *G11C 29/42* (2013.01);
(Continued)

(58) Field of Classification Search
CPC ...... G11C 7/222; G11C 29/4401; H03K 5/26; H03L 7/0992; H03L 7/0995
See application file for complete search history.

(56) References Cited

U.S. PATENT DOCUMENTS

| 5,712,595 A | 1/1998 | Yokoyama |
| 5,740,123 A | 4/1998 | Uchida |
| (Continued) | | |

FOREIGN PATENT DOCUMENTS

| CN | 1194440 A | 9/1998 |
| CN | 1674145 A | 9/2005 |
| (Continued) | | |

OTHER PUBLICATIONS

International Search Report in the international application No. PCT/CN2021/106524, dated Mar. 28, 2022. 5 pages with English translation.

(Continued)

*Primary Examiner* — Metasebia T Retebo
(74) *Attorney, Agent, or Firm* — Syncoda LLC; Feng Ma

(57) ABSTRACT

A signal generation circuit includes: a clock module, configured to generate a clock signal based on a flag signal; a control module, configured to generate a control signal according to number of transitions of the clock signal within a fixed time; and a generation module, respectively connected to the clock module and the control module, and configured to receive the clock signal, the control signal, and the flag signal, and to generate a target signal. When the flag signal changes from a first level to a second level, the target signal changes from a third level to a fourth level. After being maintained at the fourth level for a target duration, the target signal changes from the fourth level to the third level.

(Continued)

The generation module is further configured to determine the target duration according to the clock signal and the control signal.

17 Claims, 4 Drawing Sheets

(51) Int. Cl.
   *G11C 29/12* (2006.01)
   *G11C 29/42* (2006.01)
   *G11C 29/44* (2006.01)
   *H03K 5/26* (2006.01)

(52) U.S. Cl.
   CPC .......... *G11C 29/4401* (2013.01); *H03K 5/26* (2013.01); *H03L 7/0992* (2013.01); *H03L 7/0995* (2013.01)

(56) References Cited

U.S. PATENT DOCUMENTS

| | | | |
|---|---|---|---|
| 5,844,859 | A | 12/1998 | Iwamoto |
| 5,903,513 | A | 5/1999 | Itou |
| 6,111,807 | A | 8/2000 | Ooishi |
| 7,046,579 | B2 | 5/2006 | Suyama |
| 7,142,469 | B2 | 11/2006 | Kim |
| 7,417,905 | B2 | 8/2008 | Cheng |
| 7,627,839 | B1 | 12/2009 | Chan |
| RE42,202 | E | 3/2011 | Kim |
| 8,189,411 | B2 | 5/2012 | Kim |
| 8,232,824 | B2 | 7/2012 | Wang |
| 10,068,626 | B2 | 9/2018 | Eaton |
| 11,024,350 | B2 | 6/2021 | Kim |
| 11,769,536 | B2 * | 9/2023 | Huang ............... G11C 7/22 365/233.1 |
| 2001/0021142 | A1 | 9/2001 | Ooishi |
| 2005/0030077 | A1 * | 2/2005 | Kawabata ............ G06F 1/3237 327/165 |
| 2005/0213400 | A1 | 9/2005 | Kim |
| 2008/0062781 | A1 | 3/2008 | Cheng |
| 2010/0259308 | A1 | 10/2010 | Wang |
| 2011/0109362 | A1 | 5/2011 | Kim |
| 2013/0015893 | A1 | 1/2013 | Severson |
| 2019/0347157 | A1 * | 11/2019 | Waldrop ............ G06F 11/1032 |
| 2020/0372958 | A1 | 11/2020 | Kasai |
| 2021/0117349 | A1 | 4/2021 | Kim |
| 2022/0310143 | A1 | 9/2022 | Chang |

FOREIGN PATENT DOCUMENTS

| | | |
|---|---|---|
| CN | 201690355 U | 12/2010 |
| CN | 101977037 A | 2/2011 |
| CN | 111986722 A | 11/2020 |
| CN | 112669888 A | 4/2021 |
| CN | 115133911 A | 9/2022 |
| GB | 2298726 A | 9/1996 |
| WO | 2013009918 A1 | 1/2013 |
| WO | 2022198894 A1 | 9/2022 |

OTHER PUBLICATIONS

International Search Report in the international application No. PCT/CN2021/112810, dated Mar. 31, 2022. 6 pages with English translation.

Supplementary European Search Report in the European application No. 21867917.3, dated Dec. 21, 2022. 9 pages.

First Office Action of the Taiwanese application No. 111120494, dated May 3, 2023. 8 pages with English abstract.

Notice of Allowance of the U.S. Appl. No. 17/651,475, dated May 24, 2023. 27 pages.

* cited by examiner

SIGNAL GENERATION CIRCUIT AND METHOD, AND SEMICONDUCTOR MEMORY

CROSS-REFERENCE TO RELATED APPLICATIONS

This application is continuation of PCT/CN2021/106524 filed on Jul. 15, 2021, which claims priority to Chinese Patent Application No. 202110750378.3 filed on Jul. 2, 2021. The disclosures of these applications are hereby incorporated by reference in their entirety.

BACKGROUND

A semiconductor memory may include a volatile memory (such as a Dynamic Random-Access Memory (DRAM) or a static random-access memory) and a non-volatile memory (such as a flash memory, a phase-change memory, a ferroelectric memory, a magnetic memory, or a resistive memory). Generally, the volatile memory supports high-speed random access, and is often used as the main memory of a computing system (such as a personal computer, a server, or a workstation).

SUMMARY

This application relates to, but is not limited to, a signal generation circuit and method, and a semiconductor memory.

In a first aspect, embodiments of this application provide a signal generation circuit, including:

a clock module, configured to generate a clock signal based on a flag signal;

a control module, configured to generate a control signal according to number of transitions of the clock signal within a fixed time; and a generation module, respectively connected to the clock module and the control module, and configured to receive the clock signal, the control signal, and the flag signal and generate a target signal, when the flag signal changes from a first level to a second level, the target signal changes from a third level to a fourth level, and after being maintained at the fourth level for a target duration, the target signal changes from the fourth level to the third level; and the generation module being further configured to determine the target duration according to the clock signal and the control signal.

In a second aspect, embodiments of this application provide a signal generation method, including:

generating, with a clock module, a clock signal based on a flag signal, and outputting the clock signal to a generation module;

generating, with a control module, a control signal according to the number of transitions of the clock signal within a fixed time, and outputting the control signal to the generation module; and receiving, with the generation module, the clock signal, the control signal, and the flag signal, and generating a target signal, when the flag signal changes from a first level to a second level, the target signal changes from a third level to a fourth level, and after being maintained at the fourth level for a target duration, the target signal changes from the fourth level to the third level; and the target duration being determined with the generation module according to the clock signal and the control signal.

In a third aspect, embodiments of this application provide a semiconductor memory, including the signal generation circuit according to any one of the embodiments in the first aspect.

DETAILED DESCRIPTION

Figure 1:
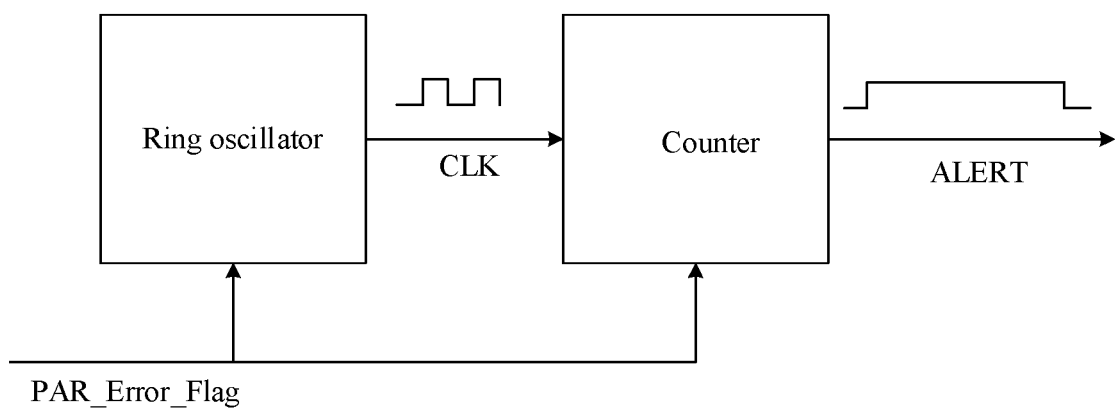
FIG. 1 shows a parity check alert circuit of a DDR4 chip.

Exemplary implementation modes disclosed in this application will be described in more detail below with reference to accompanying drawings. Although the accompanying drawings show exemplary implementation modes of this application, it should be understood that this application can be implemented in various forms and should not be limited by the specific implementation modes set forth here. On the contrary, these implementation modes are provided for a more thorough understanding of this application and to fully convey the scope of the disclosure of this application to persons skilled in the art.

In the following description, many specific details are given in order to provide a more thorough understanding of this application. However, it is apparent to persons skilled in the art that this application can be implemented without one or more of these details. In other examples, to avoid confusion with this application, some of the technical features well known in the art are not described. That is, all the features of actual embodiments are not described herein, and well-known functions and structures are not described in detail.

In addition, the accompanying drawings are only schematic illustrations of this application, and are not necessarily drawn in proportion. The same reference numerals in the drawings denote the same or similar parts, and thus, the repeated descriptions thereof will be omitted. Some of the block diagrams shown in the accompanying drawings are functional entities, and do not necessarily correspond to physically or logically independent entities. These functional entities can be implemented in the form of software, or implemented in one or more hardware modules or integrated circuits, or implemented in different networks and/or processor apparatuses and/or microcontroller apparatuses.

The flowchart shown in an accompanying drawing is only an exemplary description, and does not necessarily include all steps. For example, some of the steps can be decomposed, while some of the steps can be combined or partially combined, and therefore, the actual execution order can be changed according to actual situations.

The purpose of the terms used herein is only to describe specific embodiments and not as a limitation of this application. When used herein, the singular forms "a", "one", and "the/this" are also intended to include plural forms, unless the context clearly indicates otherwise. It should also be understood that the terms "composition" and/or "including", when used in this description, determine the existence of the described features, integers, steps, operations, elements, and/or components, but do not exclude the existence or addition of one or more other features, integers, steps, operations, elements, components, and/or groups. When used herein, the term "and/or" includes any and all combinations of related listed items.

In a manufacturing process of semiconductor memories, due to the position difference on a same wafer, or the difference in the parameters of field-effect transistors between different batches of wafers, the manufactured semiconductor memories have different process corners. Therefore, the clock signal generated by a ring oscillator in the semiconductor memory will change with the change of a process, and the signal controlled by this clock signal will also change with the process. As a result, the signal controlled by this clock signal in different semiconductor memories will have a certain error from an expected value in different process corners, and may even exceed a standard requirement.

In the specification (SPEC) of a DDR4 chip, the pulse width tPAR_ALERT_PW of an ALERT signal output by a command/address (C/A) bus parity check alert system is specified between 60 ns and 120 ns. FIG. 1 shows a parity check alert circuit of a DDR4 chip. In this circuit design, after a parity check error occurs, a PAR_Error_Flag signal is output to enable a ring oscillator, such that the ring oscillator generates a clock signal CLK with a fixed cycle of T'. Then the stage N' of a counter is determined according to the SPEC requirement of tPAR_ALERT_PW. Through this circuit design, the parity check alert circuit outputs logic 1 when receiving the PAR_Error_Flag signal, and then outputs logic 0 after the counting of the counter ends, and the final result is the pulse width of the output ALERT signal tPAR_ALERT_PW=T'×N', T' being the cycle of the clock signal generated by the ring oscillator, and N' being the stage of the counter.

Figure 2:
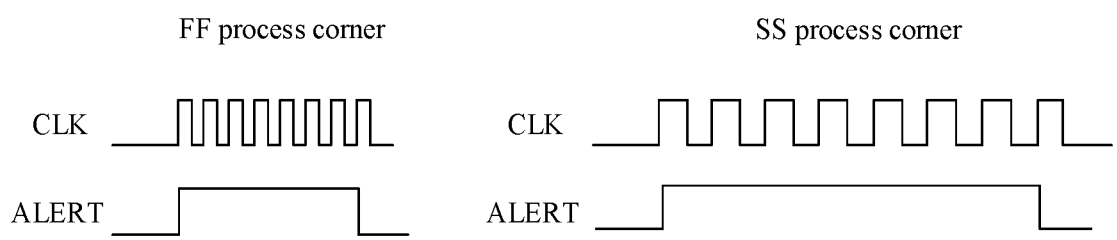
FIG. 2 is a schematic diagram of the pulse width variation of an ALERT signal in different processes.

However, although the pulse width of the ALERT signal output in this circuit design does not change with the change of the operating frequency of the chip, it will change with the change of a process. In a manufacturing process of semiconductor devices, due to the position difference on a same wafer, or the difference in the parameters of field-effect transistors between different batches of wafers, there will be variations. Such variations are called process corners. The process corners are generally divided into three process corners, i.e., slow-slow (SS), typical-typical (TT), and fast-fast (FF). FIG. 2 shows a pulse width variation of an ALERT signal in different process corners. As shown in FIG. 2, in the case of a particularly large process variation, the cycle T' of a clock signal CLK generated by a ring oscillator will be very different. For example, in an FF process corner, the cycle T' of the clock signal CLK generated by the ring oscillator is relatively small, while in an SS process corner, the cycle T' of the clock signal CLK generated by the ring oscillator is relatively large. Under the amplification of the stage N' of a counter, finally the pulse width tPAR_ALERT_PW of an ALERT signal in the SS process corner would easily exceed the 60 ns-120 ns range specified by the SPEC, while the pulse width tPAR_ALERT_PW of the ALERT signal in the FF process corner would also be easily smaller than the 60 ns-120 ns range specified by the SPEC.

Figure 3:
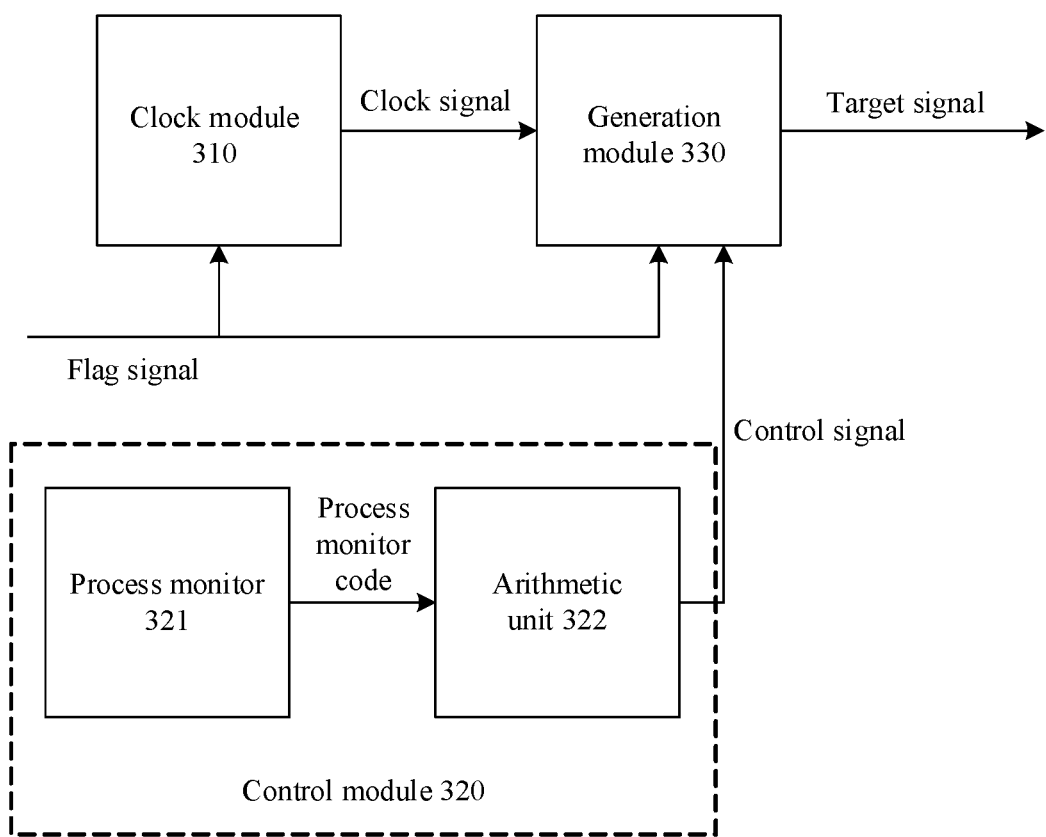
FIG. 3 is a schematic structural diagram of a signal generation circuit provided by embodiments of this application.

Embodiments of this application provide a signal generation circuit. FIG. 3 is a schematic structural diagram of a signal generation circuit provided by embodiments of this application. As shown in FIG. 3, the circuit includes:

a clock module 310, configured to generate a clock signal based on a flag signal;

a control module 320, configured to generate a control signal according to the number of transitions of the clock signal within a fixed time; and a generation module 330, respectively connected to the clock module 310 and the control module 320, and configured to receive the clock signal, the control signal, and the flag signal and generate a target signal, when the flag signal changes from a first level to a second level, the target signal changes from a third level to a fourth level, and after being maintained at the fourth level for a target duration, the target signal changes from the fourth level to the third level; and the generation module 330 being further configured to determine the target duration according to the clock signal and the control signal.

Here, the target duration in which the target signal output with the generation module 330 is maintained at the fourth level is the pulse width of the target signal output with the generation module 330.

In the embodiments of this application, the control signal is generated according to the number of transitions of the clock signal within a fixed time, such that the control signal is a signal related to the clock signal, such that when the frequency/cycle of the clock signal changes, the control signal can also change accordingly, such that the pulse width of the target signal can be adjusted through the clock signal and the control signal.

Further, in the embodiments of this application, the pulse width of the target signal is adjusted through the clock signal and the control signal to control the pulse width of the target signal within a certain range, so as to reduce or eliminate the change of the pulse width of the target signal with the clock signal, thereby stabilizing the pulse width of the target signal.

The embodiments of this application provide a signal generation circuit, configured to generate a target signal and adjust the pulse width of the target signal to stabilize same within a certain range. This signal generation circuit can be widely used in semiconductor memories, such as DDR2, DDR3, DDR4, LPDDR2, and LPDDR3, which will not be listed here.

The clock module 310 provided by the embodiments of this application includes a ring oscillator. When the flag signal changes from the first level to the second level, the ring oscillator generates the clock signal. In the embodiments of this application, the ring oscillator is used to generate the clock signal as an internal clock signal.

In the embodiments of this application, the control module 320 includes a process monitor 321 and an arithmetic unit 322, where the process monitor 321 is configured to output a process monitor code representing the number of transitions of the clock signal within a fixed time; and the arithmetic unit 322 is configured to receive the process monitor code, multiply the process monitor code by a coefficient and then output as the control signal. In the embodiments of this application, the control signal is obtained by multiplying the process monitor code by the coefficient.

Here, the process monitor code is a parameter representing the number of transitions of the clock signal within a fixed time in a test mode. Because the number of transitions of the clock signal within a fixed time will change with the change of a process, the process monitor code will also change with the change of the process. Specifically, different chips on a same wafer or a same batch of wafers can have different process corners, therefore, the frequencies/cycles of the clock signals of these chips with different process corners will be different, and therefore, the process monitor codes representing the number of transitions of the clock signal within a fixed time will also be different. In the embodiments of this application, such a difference caused by different process corners is called as a change with a process. In the embodiments of this application, the pulse width of the target signal is adjusted by using the change of the process monitor code with the process and the change of the clock signal with the process to control the pulse width of the target signal within a certain range, so as to reduce or eliminate the change of the pulse width of the target signal with the process, thereby stabilizing the pulse width of the target signal.

The frequency of the clock signal decreases with the change of the process, in other words, the cycle of the clock signal increases with the change of the process. Therefore, when the frequency of the clock signal decreases or the cycle of the clock signal increases, the number of transitions of the clock signal within a fixed time will decrease. In this way, the process monitor code will also decrease with the change of the process. Moreover, the control signal is a signal obtained by multiplying the process monitor code by a coefficient, and therefore, the control signal will also decrease with the change of the process. The change of the process is a change from an FF process corner to an SS process corner.

Figure 4:
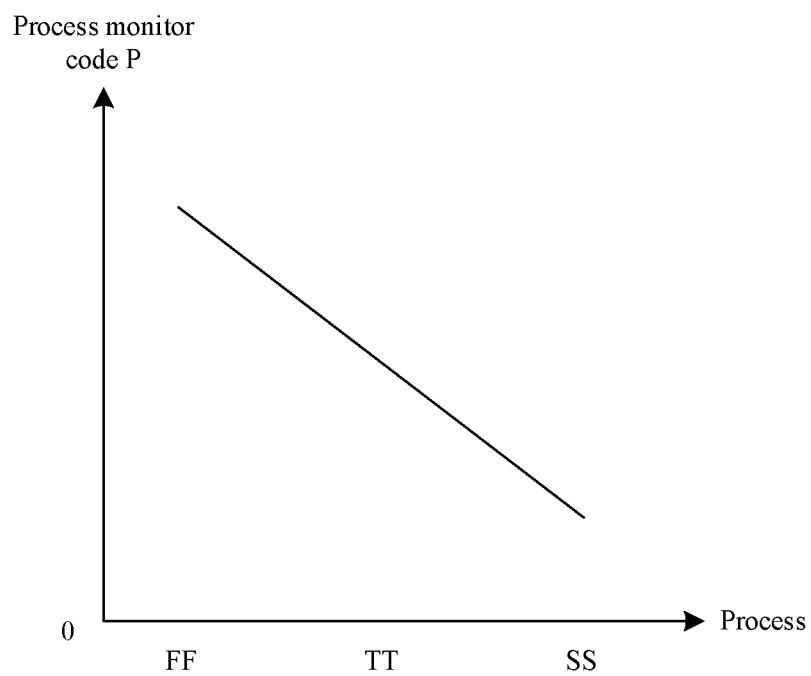
FIG. 4 is a trend diagram of the change of a process monitor code with a process provided by embodiments of this application.

In a specific implementation mode, when the signal generation circuit is applied to a DDR4 chip, the process monitor 321 is configured to output a process monitor code P; and the arithmetic unit 322 is configured to receive the process monitor code P, multiply the process monitor code by a coefficient N and then output as the control signal. FIG. 4 is a trend diagram of the change of a process monitor code with a process provided by embodiments of this application. The process monitor code P represents the number of transitions of the clock signal within a fixed time, the process monitor code P decreases with the change of the process, the trend of the change of the process monitor code P with the process is opposite to the trend of the change of the cycle of the clock signal with the process, and therefore, the control signal generated based on the process monitor code P can effectively compensate for the change of the pulse width of the target signal with the process.

Here, the coefficient N is an amplification coefficient of the process monitor code. In actual application, the corresponding coefficient N can be selected according to the actual pulse width of the target signal. Here, the stage of a counter is a target value N×P represented by the control signal. In the embodiments of this application, the process monitor code P decreases with the change of the process, such that the target value represented by the control signal decreases with the change of the process. The change of the process is a change from an FF process corner to an SS process corner.

Here, the control signal is a counter stage selection signal of the counter, and the counter can determine its stage according to the control signal, so as to perform counting based on the stage.

In the embodiments of this application, the flag signal is a check flag signal, and the check flag signal is used for representing a parity check error or a redundancy check error.

In the embodiments of this application, the generation module 330 includes a counter. When the flag signal changes from the first level to the second level, the counter starts to count the clock signal, and when a count value reaches the target value represented by the control signal, the target signal is controlled to change from the fourth level to the third level. When the flag signal is used to represent a parity check error, after a parity check error occurs, the flag signal PAR_Error_Flag is output. The flag signal PAR_Error_Flag is valid at a high level, such that when the flag signal PAR_Error_Flag changes from a low level to a high level, the generation module controls the target signal to change from a low level to a high level. Meanwhile, the counter starts to count the clock signal, and when the count value reaches the target value represented by the control signal, the target signal is controlled to change from the high level to the low level.

In some embodiments, the flag signal is used to represent a parity check error. After a parity check error occurs, the check flag signal PAR_Error_Flag is output. Then the target signal generated with the generation module is a parity check alert signal ALERT. Therefore, the pulse width tPAR_ALERT_PW of the parity check alert signal can be adjusted through the signal generation circuit provided by the embodiments of this application to control the pulse width tPAR_ALERT_PW of the parity check alert signal within a certain range, so as to reduce or eliminate the change of the pulse width tPAR_ALERT_PW of the parity check alert signal with the process, thereby stabilizing the pulse width tPAR_ALERT_PW of the parity check alert signal within the range specified by the SPEC.

It should be noted that the ALERT signal here is not a signal that is finally output through an alert_n pin, and the ALERT signal needs to pass through several inverters or output buffer circuits before it is output to the alert_n pin of the chip. In a specific example, the ALERT signal can be output to the alert_n pin of the chip after passing through an odd number of inverters, so as to ensure that the alert_n signal output by the alert_n pin is valid at a low level.

Here, the stage of the counter is the target value N×P represented by the control signal. If the cycle of the clock signal is T, the target duration (the pulse width of the target signal) is T×N×P. The trends of the changes of P and T with the process are opposite. Therefore, the target duration (the pulse width of the target signal) hardly changes with the change of the process, in other words, the target duration (the pulse width of the target signal) is stabilized within the range specified by the SPEC in different processes. The change of the process is a change from an FF process corner to an SS process corner.

Figure 5:
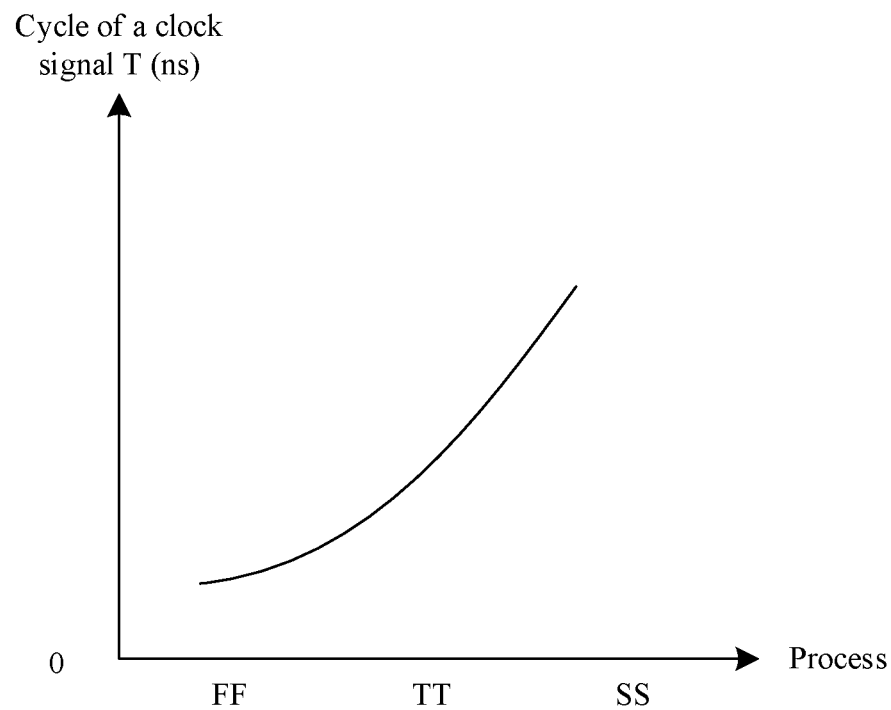
FIG. 5 is a trend diagram of the change of the cycle of a clock signal with a process provided by embodiments of this application.
Figure 6:
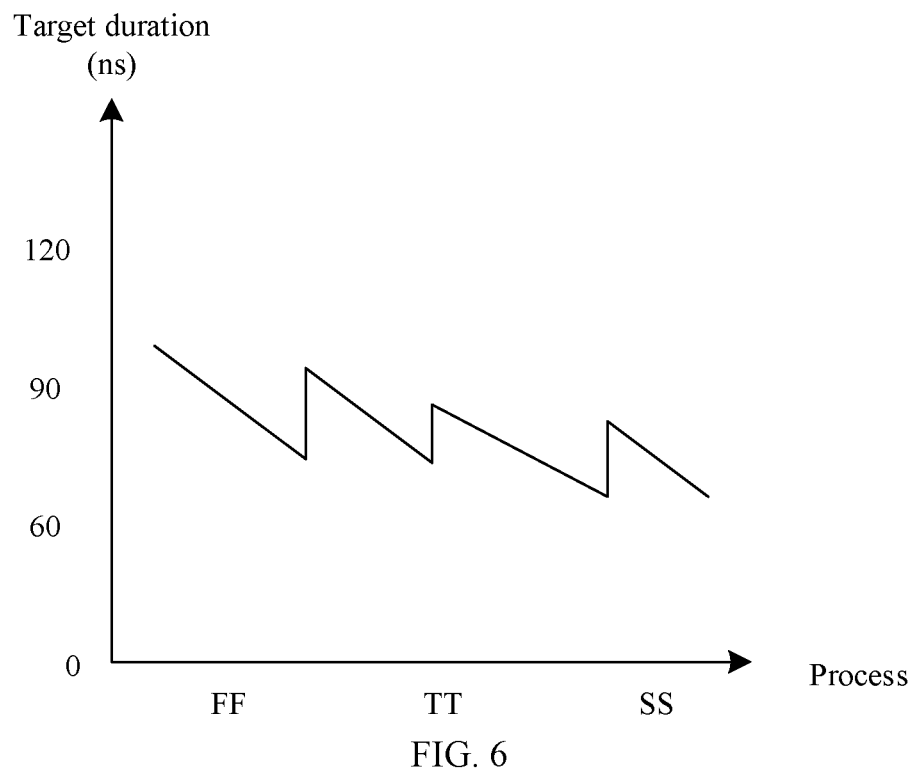
FIG. 6 is a trend diagram of the change of a target duration with a process provided by embodiments of this application.

FIG. 5 is a trend diagram of the change of the cycle of a clock signal with a process provided by embodiments of this application. FIG. 6 is a trend diagram of the change of a target duration with a process provided by embodiments of this application. In FIG. 5, the ordinate is the cycle of the clock signal, and the abscissa is the process. In FIG. 6, the ordinate is a target duration, and the abscissa is the process. As shown in FIG. 4, FIG. 5, and FIG. 6, the cycle of the clock signal T increases with the change of the process, and the process monitor code P representing the number of transitions of the clock signal within a fixed time decreases with the change of the process, such that the target value N×P represented by the control signal also decreases with the change of the process, and then the target duration T×N×P obtained based on the cycle of the clock signal T and the target value N×P represented by the control signal can be stabilized within the range specified by the SPEC in the case of the change of the process.

Figure 7:
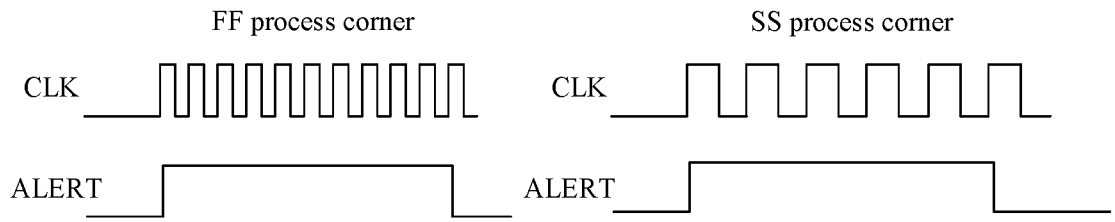
FIG. 7 is a schematic diagram of the pulse width of an ALERT signal in different processes.

FIG. 7 is a schematic diagram of the pulse width of an ALERT signal in different processes. The ALERT signal in FIG. 7 is generated based on the signal generation circuit provided by the embodiments of this application. As shown in FIG. 7, in an FF process corner, the cycle T of a clock signal CLK generated by a ring oscillator is relatively small, but a target value N×P (the stage of a counter) represented by a control signal is relatively large. In an SS process corner, the cycle T of the clock signal CLK generated by the ring oscillator is relatively large, but the target value N×P (the stage of the counter) represented by the control signal is relatively small. Therefore, the pulse width of the finally output ALERT signal does not change much in an FF process corner and an SS process corner. That is, under the joint control of the clock signal and the control signal, the pulse width of the target signal can be controlled within a certain range, so as to reduce or eliminate the change of the pulse width of the target signal with the process, thereby stabilizing the pulse width of the target signal within the range specified by the SPEC.

In the embodiments of this application, the first level is a low level, the second level is a high level, the third level is a low level, and the fourth level is a high level. Then when the flag signal changes from a low level to a high level, the target signal changes from a low level to a high level, and after being maintained at the high level for a target duration, the target signal changes from the high level to the low level. Here, if the flag signal is a check flag signal, the check flag signal is valid at the high level. When the check flag signal is at the high level, it is indicated that a check error has occurred; and when the check flag signal is at the low level, it is indicated that no check error has occurred. In the embodiments of this application, the target duration is determined according to the cycle of the clock signal and the target value represented by the control signal, and the trends of the changes of the cycle of the clock signal and the target value represented by the control signal with the process are opposite. Therefore, the target duration (the pulse width of the target signal) hardly changes with the change of the process, in other words, the target duration (the pulse width of the target signal) remains stable in different processes.

Figure 8:
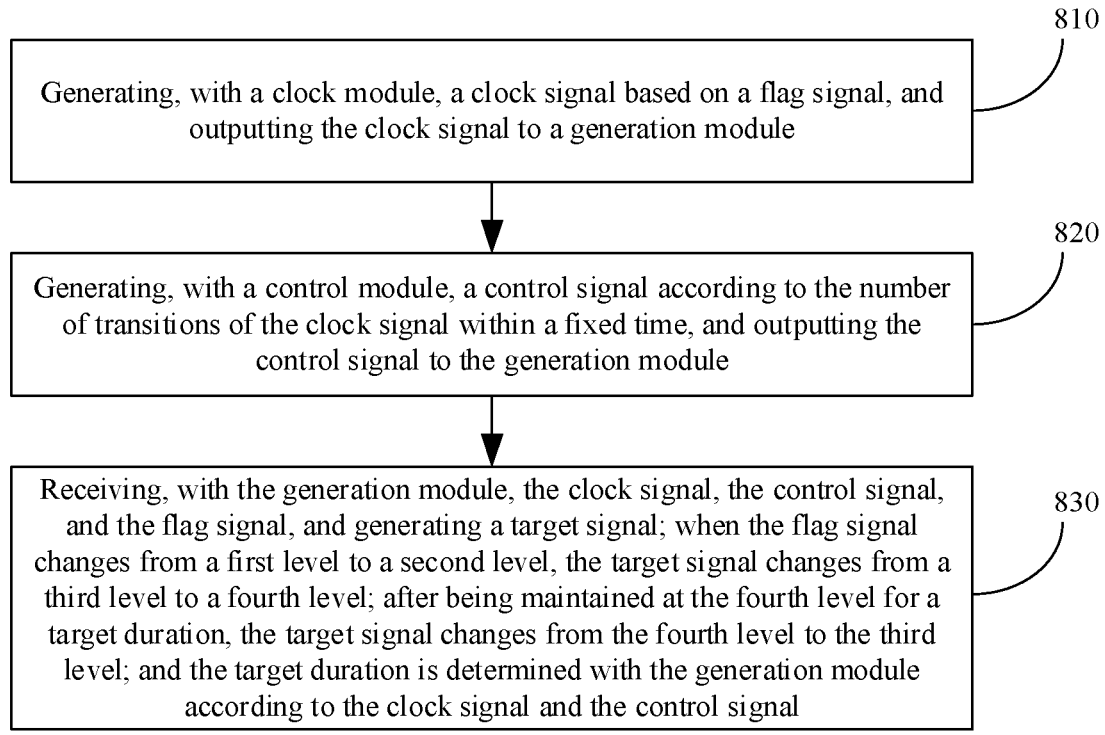
FIG. 8 is a schematic flowchart of implementation of a signal generation method provided by embodiments of this application.

Based on the same technical concept as the foregoing signal generation circuit, embodiments of this application provide a signal generation method. FIG. 8 is a schematic flowchart of implementation of a signal generation method provided by embodiments of this application. As shown in FIG. 8, the method mainly includes the following steps.

At step 810, a clock signal is generated with a clock module based on a flag signal, and the clock signal is output to a generation module.

At step 820, a control signal is generated with a control module according to the number of transitions of the clock signal within a fixed time, and the control signal is output to a generation module.

At step 830, the clock signal, the control signal, and the flag signal are received with the generation module, and a target signal is generated, when the flag signal changes from a first level to a second level, the target signal changes from a third level to a fourth level, and after being maintained at the fourth level for a target duration, the target signal changes from the fourth level to the third level; and the target duration being determined with the generation module according to the clock signal and the control signal.

Here, the target duration in which the target signal output with the generation module is maintained at the fourth level is the pulse width of the target signal output with the generation module.

In the embodiments of this application, the flag signal is a check flag signal, and the check flag signal is used to represent a parity check error or a redundancy check error.

In the embodiments of this application, step 810 includes: when the flag signal changes from the first level to the second level, generating, by the ring oscillator, the clock signal. In the embodiments of this application, the ring oscillator is used to generate the clock signal as an internal clock signal.

In the embodiments of this application, the control signal is generated according to the number of transitions of the clock signal within a fixed time, such that the control signal is a signal related to the clock signal, such that when the frequency/cycle of the clock signal changes, the control signal can also change accordingly, such that the pulse width of the target signal can be adjusted through the clock signal and the control signal.

Further, in the embodiments of this application, the pulse width of the target signal is adjusted through the clock signal and the control signal to control the pulse width of the target signal within a certain range, so as to reduce or eliminate the change of the pulse width of the target signal with the clock signal, thereby stabilizing the pulse width of the target signal.

In the embodiments of this application, step 820 includes: outputting, with a process monitor, a process monitor code representing the number of transitions of the clock signal within a fixed time; and receiving, with an arithmetic unit, the process monitor code, multiplying the process monitor code by a coefficient and then outputting as the control signal.

Here, the process monitor code is a parameter representing the number of transitions of the clock signal within a fixed time in a test mode. Because the number of transitions of the clock signal within a fixed time will change with the change of a process, the process monitor code will also change with the change of the process. In the embodiments of this application, the pulse width of the target signal is adjusted by using the change of the process monitor code with the process and the change of the clock signal with the process to control the pulse width of the target signal within a certain range, so as to reduce or eliminate the change of the pulse width of the target signal with the process, thereby stabilizing the pulse width of the target signal.

The frequency of the clock signal decreases with the change of the process, in other words, the cycle of the clock signal increases with the change of the process. Therefore, when the frequency of the clock signal decreases or the cycle of the clock signal increases, the number of transitions of the clock signal within a fixed time will decrease. In this way, the process monitor code will also decrease with the change of the process. Moreover, the control signal is a signal obtained by multiplying the process monitor code by a coefficient, and therefore, the control signal will also decrease with the change of the process. The change of the process is a change from an FF process corner to an SS process corner.

In the embodiments of this application, the when the flag signal changes from a first level to a second level, the target signal changes from a third level to a fourth level, after being maintained at the fourth level for a target duration, the target signal changes from the fourth level to the third level includes: when the flag signal changes from the first level to the second level, counting, with a counter, the clock signal, and when a count value reaches a target value represented by the control signal, controlling, with the counter, the target signal to change from the fourth level to the third level.

Here, the stage of the counter is the target value N×P represented by the control signal. If the cycle of the clock signal is T, the target duration (the pulse width of the target signal) is T×N×P. The trends of the changes of P and T with the process are opposite. Therefore, the target duration (the pulse width of the target signal) hardly changes with the change of the process, in other words, the target duration (the pulse width of the target signal) remains stable in different processes.

In the embodiments of this application, the first level is a low level, the second level is a high level, the third level is a low level, and the fourth level is a high level.

Embodiments of this application further provide a semiconductor memory, including the forgoing signal generation circuit. The semiconductor memory specified in this application includes, but is not limited to, a DRAM, etc. The semiconductor memory can use the signal generation circuit of this application to adjust the pulse width of a target signal generated thereby, such that the pulse width of the target signal is not affected by a process, and is stabilized within a certain range. In other words, the semiconductor memory can use the signal generation circuit of this application to adjust the pulse width of the target signal generated thereby, such that the pulse width of the target signal is not affected by a process corner thereof, and is stabilized within a certain range.

In the embodiments of this application, the DRAM chip conforms to a DDR4 memory specification.

The methods disclosed in the several method embodiments provided by this application can be arbitrarily combined without conflicts to obtain new method embodiments.

The features disclosed in the several apparatus embodiments provided by this application can be arbitrarily combined without conflicts to obtain new apparatus embodiments.

The descriptions above are only specific implementation modes of this application. However, the scope of protection of this application is not limited thereto. Any change or substitution that could be easily conceived of by those skilled in the art within the technical scope disclosed by this application should all fall within the scope of protection of this application. Therefore, the scope of protection of this application should be subject to the scope of protection of the claims.

What is claimed is:

1. A signal generation circuit, comprising:
   a clock module, configured to generate a clock signal based on a flag signal;
   a control module, configured to generate a control signal according to number of transitions of the clock signal within a fixed time; and
   a generation module, respectively connected to the clock module and the control module, and configured to receive the clock signal, the control signal, and the flag signal, and to generate a target signal;
   wherein
   when the flag signal changes from a first level to a second level, the target signal changes from a third level to a fourth level;
   after being maintained at the fourth level for a target duration, the target signal changes from the fourth level to the third level; and
   the generation module is further configured to determine the target duration according to the clock signal and the control signal.

2. The signal generation circuit of claim 1, wherein
   the clock module comprises a ring oscillator; and
   when the flag signal changes from the first level to the second level, the ring oscillator generates the clock signal.

3. The signal generation circuit of claim 1, wherein
   the generation module comprises a counter;
   when the flag signal changes from the first level to the second level, the counter starts to count the clock signal; and
   when a count value reaches a target value represented by the control signal, the target signal is controlled to change from the fourth level back to the third level.

4. The signal generation circuit of claim 1, wherein
   the first level is a low level;
   the second level is a high level;
   the third level is a low level; and
   the fourth level is a high level.

5. The signal generation circuit of claim 1, wherein
   the flag signal is a check flag signal; and
   the check flag signal is configured to represent a parity check error or a redundancy check error.

6. The signal generation circuit of claim 1, wherein
   a cycle of the clock signal increases with the change of a process;
   the target value represented by the control signal decreases with the change of the process; and
   the change of the process is a change from an FF process corner to an SS process corner.

7. The signal generation circuit of claim 1, wherein the control module comprises a process monitor and an arithmetic unit, wherein
   the process monitor is configured to output a process monitor code representing the number of transitions of the clock signal within the fixed time; and
   the arithmetic unit is configured to receive the process monitor code, multiply the process monitor code by a coefficient and then output as the control signal.

8. A signal generation method, comprising:
   generating, with a clock module, a clock signal based on a flag signal, and outputting the clock signal to a generation module;
   generating, with a control module, a control signal according to number of transitions of the clock signal within a fixed time, and outputting the control signal to the generation module; and
   receiving, with the generation module, the clock signal, the control signal, and the flag signal, and generating a target signal;
   wherein
   when the flag signal changes from a first level to a second level, the target signal changes from a third level to a fourth level;
   after being maintained at the fourth level for a target duration, the target signal changes from the fourth level to the third level; and
   the target duration is determined with the generation module according to the clock signal and the control signal.

9. The signal generation method of claim 8, wherein the generating, with a clock module, a clock signal based on a flag signal comprises:
when the flag signal changes from the first level to the second level, generating, with a ring oscillator, the clock signal.

10. The signal generation method of claim 8, wherein said when the flag signal changes from the first level to the second level, the target signal changes from the third level to the fourth level, and after being maintained at the fourth level for a target duration, the target signal changes from the fourth level to the third level comprises:
when the flag signal changes from the first level to the second level, counting, with a counter, the clock signal; and
when a count value reaches a target value represented by the control signal, controlling, with the counter, the target signal to change from the fourth level to the third level.

11. The signal generation method of claim 8, wherein the first level is a low level;
the second level is a high level;
the third level is a low level; and
the fourth level is a high level.

12. The signal generation method of claim 8, wherein the flag signal is a check flag signal; and
the check flag signal is configured to represent a parity check error or a redundancy check error.

13. The signal generation method of claim 8, wherein a cycle of the clock signal increases with a change of a process;
the target value represented by the control signal decreases with the change of the process; and
the change of the process is a change from an FF process corner to an SS process corner.

14. The signal generation method of claim 8, wherein the generating, with a control module, a control signal according to number of transitions of the clock signal within a fixed time comprises:
outputting, with a process monitor, a process monitor code representing the number of transitions of the clock signal within the fixed time; and
receiving, with an arithmetic unit, the process monitor code, and multiplying the process monitor code by a coefficient and then outputting as the control signal.

15. A semiconductor memory, comprising a signal generation circuit, wherein the signal generation circuit comprises:
a clock module, configured to generate a clock signal based on a flag signal;
a control module, configured to generate a control signal according to number of transitions of the clock signal within a fixed time; and
a generation module, respectively connected to the clock module and the control module, and configured to receive the clock signal, the control signal, and the flag signal, and to generate a target signal;
wherein
when the flag signal changes from a first level to a second level, the target signal changes from a third level to a fourth level;
after being maintained at the fourth level for a target duration, the target signal changes from the fourth level to the third level; and
the generation module is further configured to determine the target duration according to the clock signal and the control signal.

16. The semiconductor memory of claim 15, wherein the semiconductor memory is a Dynamic Random-Access Memory (DRAM) chip.

17. The semiconductor memory of claim 16, wherein the memory of the DRAM chip conforms to a DDR4 memory specification.

\* \* \* \* \*